United States Patent [19]

Schumacher et al.

[11] 4,234,860
[45] Nov. 18, 1980

[54] PIEZOELECTRIC FILTER AND PROCESS FOR THE MANUFACTURE THEREOF

[75] Inventors: Heinz Schumacher; Hermann Zacharias, both of Cologne, Fed. Rep. of Germany

[73] Assignee: Draloric Electronic GmbH, Nuremberg, Fed. Rep. of Germany

[21] Appl. No.: 893,333

[22] Filed: Apr. 4, 1978

[30] Foreign Application Priority Data

Apr. 4, 1977 [DE] Fed. Rep. of Germany ....... 2715202

[51] Int. Cl.² .................. H03H 9/04; H03H 9/10; H03H 9/14; H01L 41/22
[52] U.S. Cl. ................................. 333/187; 29/25.35; 310/351; 333/191
[58] Field of Search ..................... 333/187, 188–192; 310/348–356, 340, 345, 326, 327, 342, 344; 29/25, 35, 424, 594, 595, 627

[56] References Cited

U.S. PATENT DOCUMENTS

| | | | |
|---|---|---|---|
| 3,676,724 | 7/1972 | Berlincourt et al. | 310/326 |
| 3,747,176 | 7/1973 | Toyoshima | 310/340 |
| 4,103,264 | 7/1978 | Howatt et al. | 310/340 |

*Primary Examiner*—Marvin L. Nussbaum
*Attorney, Agent, or Firm*—Ostrolenk, Faber, Gerb & Soffen

[57] ABSTRACT

A piezoelectric filter and the process of making the same in which the filter is enclosed in a capsule or envelope of dielectric material through which the connection for the electrodes extend. Self adhesive spacers on each principal surface of the piezoelectric filter are embossed to provide a spacing for the electrodes with respect to the envelope. In addition, slots or other openings between the embossed areas permit the envelope material to engage a surface of the filter that does not have an electrode for damping purposes. The process of manufacture is dictated by the structure and requires first the placement of the spacer in position with the enclosed areas registering with the electrodes and then the formation of the envelope.

18 Claims, 3 Drawing Figures

PIEZOELECTRIC FILTER AND PROCESS FOR THE MANUFACTURE THEREOF

BACKGROUND OF THE INVENTION

The present invention relates to a piezoelectric filter having a lamella-like resonator, which is provided at two opposed principal surfaces with at least one pair of electrodes each of which is connected to a connector element via electrical feeder lines. The resonator electrodes are covered by spacers; the supporting area of the spacers on the resonator surface are separated from the electrode areas. The entire filter arrangement is enveloped by a solid insulator layer.

Such a filter is known from German Pat. No. 1,591,298. There a caplike synthetic spacer is so arranged on the surface of the piezoelectric lamella that the resonator electrodes are covered. Since any contact between spacer and resonator electrode must be avoided, then, because of the small dimensions of such components, a very exact positioning between spacers and resonator lamella is required. With multi-electrode arrangements a precise positioning for each single spacer is required.

In German accepted application DAS No. 2,459,037 a piezoelectric filter is shown which consists of a resonator disk enveloped by a shell made of a porous duroplastic synthetic-resin material in which the resonator disk has an all-around free clearance from the shell and is attached to the shell only by the electrode feeder lines developed as a hold-down component. Since, with this type of structure, the entire resonator disk freely oscillates, the oscillations are not limited to an exactly defined area of the resonator disk so that undesired spurious resonances or reverberations leading to glitches in the conducting-state characteristic cannot be avoided.

German Pat. No. 1,914,307 describes a piezoelectric filter in which the principal surface areas of the resonator lamella are provided with electrodes coated by a wax layer, on which in turn a layer of insulator synthetic resin is applied; the wax melts on heating, and a free space around the electrodes is produced by absorption into the synthetic resin layer. The synthetic resin material must therefore be very exactly matched with the used wax so that an absorption of the wax into the synthetic resin layer is insured.

German published application DOS No. 2,607,196 describes a piezoelectric filter having a lamella-like resonator which has two electrode pairs at two opposed main surfaces and where a damping material is applied on the outside of the electrode area. There the damping material consists of an elastic carrier material, which is mixed with a powdered material e.g., a metallic powder having a considerably higher specific weight. Though with this embodiment a satisfactory acoustic match between resonator and damping layer can be established so that reverberations can be avoided, no dip coating of the filter is possible because in that case the enveloping material would be directly applied to the electrodes so that any initially produced beneficial results would be negated. This applies with equal force to German Pat. No. 2,046,421.

German published application DOS No. 2,504,550 describes a piezoelectric filter in which a synthetic envelope contacts a lamella-like resonator without any interspacing. There an inter-spacing is avoided by a thin film made of paper, resin or synthetic interpolated between resonator and synthetic envelope.

German published application DOS No. 2,123,823 describes a ceramic filter in which a lamella-like resonator is solidly held in the space of an inner housing between two spring loaded plates.

BRIEF SUMMARY OF THE INVENTION

The object of the present invention is the provision of a piezoelectric filter, which is simple in design and therefore capable of being manufactured at a competitive and favorable price, in which the oscillator zones are separated from the remaining areas of the piezoelectric lamella-like resonator in a manner which damps the structure. The filter is then enveloped in a simple manner by a dip-coating process.

The solution to the problem is achieved in accordance with the present invention by placing spacers over the electrodes which spacers consist of a self-adhesive film which has elevations according to the arrangement of electrode regions.

The self-adhesive film may be of a synthetic type or of paper. Preferably the self-adhesive film completely covers the resonator-lamella surface area, i.e., up to its edge, with exception of the areas for the connector elements. The dimensions of the elevated surface of the film areas match those of the electrode regions; the elevations preferably are tunnel or roof-like shaped.

The self-adhesive film may have slots or bores, which advantageously increase the oscillator damping of spurious resonances by a direct contact between resonator envelope and surface.

Further advantages of the invention specifically reside in the fact that the spacers can be applied very easily, and that with multi-electrode structures the applicable number of spacers can be applied in one piece to the resonator by a single adjusting step.

DETAILED DESCRIPTION OF THE INVENTION

Figure 1:
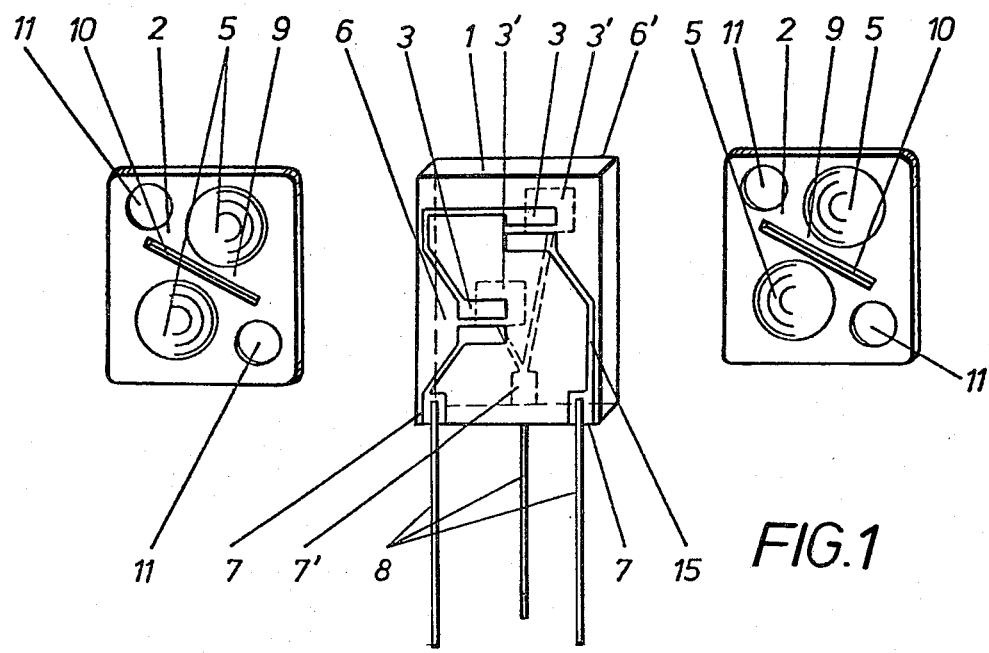
Figure 2:
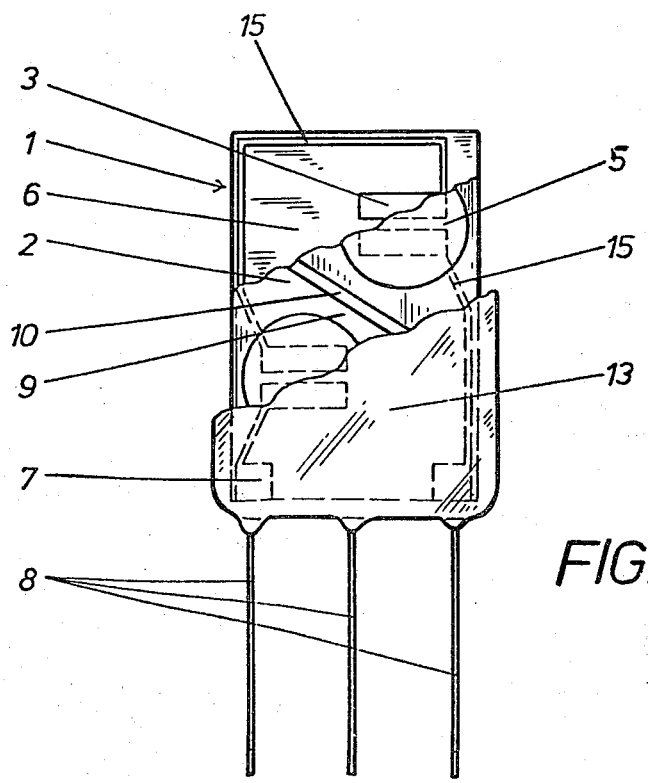
Figure 3:
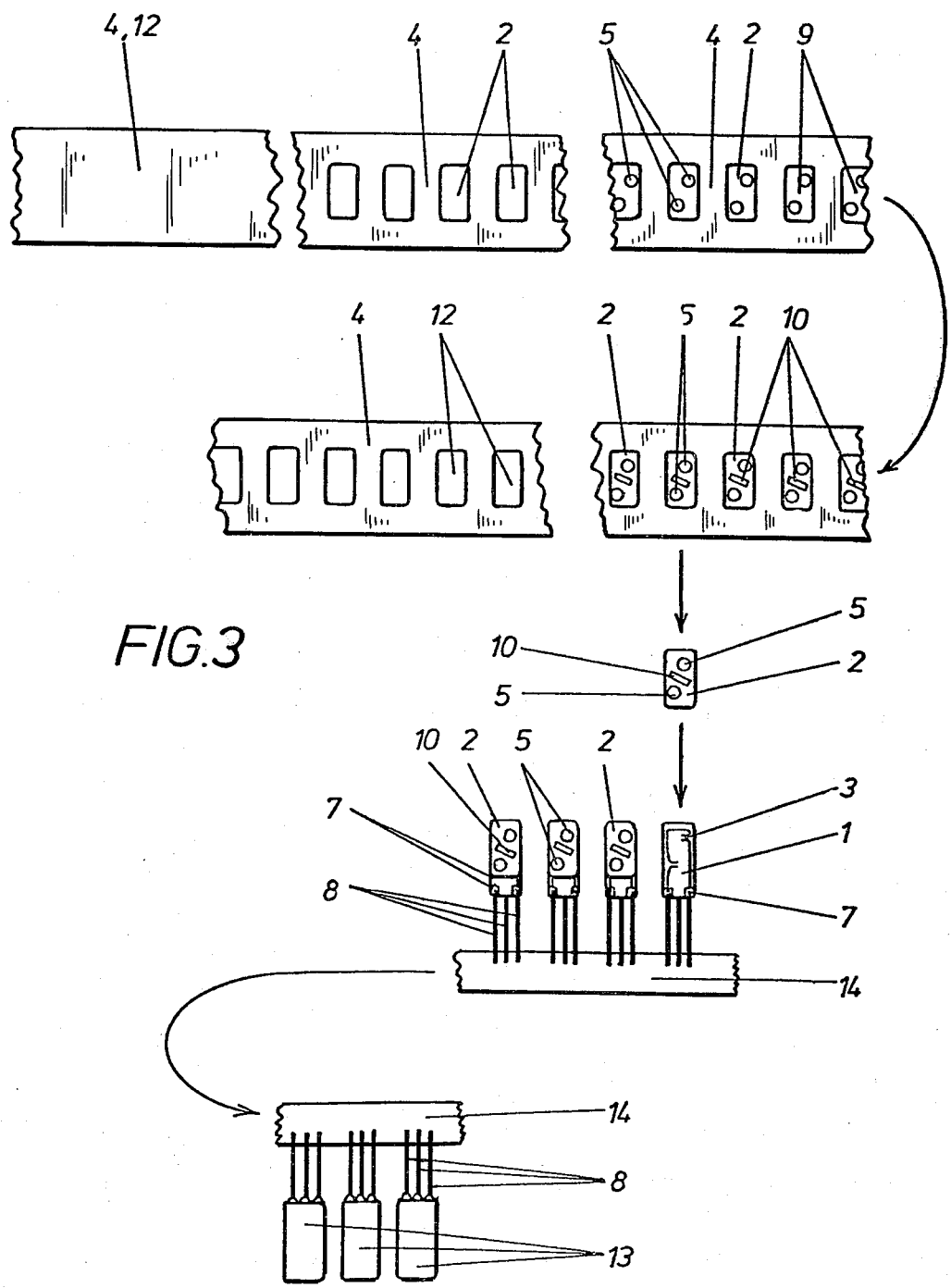

The foregoing and other objects of the present invention will be obvious from the following description and drawings in which FIG. 1 is an expanded view showing a resonator with surface adhesive films having elevations at the electrode regions, FIG. 2 is a view partly in section of a piezoelectric filter in accordance with the present invention, FIG. 3 is a schematic view of the processing steps for the manufacture of a piezoelectric filter.

FIG. 1 shows a lamella-like resonator 1 having electrodes 3 applied to a surface area 6. The opposed surface area 6' carry additional opposed electrodes 3' indicated by dotted lines. Electrodes 3,3' are interconnected and/or connected to connector surfaces 7,7' via feeder lines 15. Connector elements 8 are attached to connector surfaces 7,7'.

On each surface area 6,6' a self-adhesive spacer 2 is so attached that embossed elevations 5 cover the regions of electrodes 3, i.e., the oscillator zones, and that the remaining resonator surface areas 6,6' are covered on all sides by film-like spacer pieces 2, except for the regions of connector surfaces 7. Region 9 between both elevations 5 of spacer 2 has a slotted break-through 10, through which the enveloping material 13, hereinafter described, reaches and engages the surface of resonator 1 and thus results in a further improved damping of undesired spurious resonances.

FIG. 2 shows a lamella-like resonator 1 with electrodes 3 applied to both opposed surface areas 6 which are interconnected and/or connected to connector surfaces 7 via feeder lines 15. Connector elements 8 are attached on connector surfaces 7, connector elements 8 project from the electrically insulating envelope 13. Elevations 5 are embossed into film-like spacer 2 which overlie the regions of electrodes 3 thereby producing a hollow space over the oscillator zones underlying the envelope 13 so that the resonator can freely oscillate in these oscillator zones. In the region 9 between elevations 5 a slot 10 in spacer 2 is provided through which the material of envelope 13 has a direct damping effect on spurious resonance.

FIG. 3 shows a self-adhesive film 4-strip on an auxiliary carrier 12, on which spacers 2 are consecutively punched out. In the next operating step elevations 5 are embossed into spacers 2 with elevations 5 dimensionally matching the oscillator zones, i.e., the regions of electrodes 3 on lamella-like resonators 1. Slots 10 are punched out in the region 9 between the elevations 5. The spacers 2 are then removed from auxiliary carrier 12 and transferred to surface areas 6,6' of lamella-like resonators 1. Resonators 1 are attached by their leads 8 to a metallic transport strip 14 and, following an exact-positioned application of spacers 2 on both surface areas 6,6', are moved to an envelope application stage. On drying and hardening of the envelope 13, the finished filters are separated from transport strip 14 and moved on to further testing and inspection stages.

In the foregoing the present invention has been described in connection with illustrative embodiments thereof. Since variations and modifications may now be obvious to those skilled in the art, it is preferred that the scope of this invention be defined, not by the specific disclosures herein contained, but only by the appended claims.

We claim:

1. A piezoelectric filter, comprising:
   a resonator including: a resonator body, having two opposite principal surfaces, at least one electrode on each of said surfaces, and a respective external connector for each of said electrodes, each of said external connectors being in electric contact with its respective electrode;
   an ian insulating envelope encasing said resonator; said connectors extending through said envelope; and
   a respective spacer between each of said two principal surfaces of said resonator body and said envelope; said spacers each comprising a preformed self-adhesive film and having a first set of regions which register with respective ones of said electrodes and which are maintained out of physical contact with said electrodes, and each of said spacers having a second set of regions that are in contact with said resonator body.

2. The piezoelectric filger of claim 1 wherein said first and second sets of regions of each of said spacers are continuous with each other on each of said principal surfaces of said resonator body.

3. The piezoelectric filter of claim 2 in which each of said spacers completely covers the one of said principal surfaces to which it is applied leaving uncovered only sufficient space for connection to said connectors.

4. The piezoelectric filter of claim 1 wherein said second set of regions of each of said spacers defines a respective plane and said first set of regions is raised out of a respective one of said planes of said second sets of regions to form bosses.

5. The piezoelectric filter of claim 3 wherein said second set of regions of each of said spacers defines a respective plane and said first set of regions is raised out of a respective one of said planes of said second sets of regions to form bosses.

6. The piezoelectric filter of claim 1 wherein each of said spacers on each side has openings in said second set of regions permitting said envelope to engage said surfaces through said openings.

7. The piezoelectric filter of claim 5 wherein each of said spacers has openings in said second set of regions permitting said envelope to engage said surfaces through said openings.

8. The piezoelectric filter of claim 1 wherein said spacers are formed of paper.

9. The piezoelectric filter of claim 1 wherein said spacers are formed of an electrically non-conductive synthetic material.

10. A method of manufacturing a piezoelectric filter, comprising the steps of:
    preparing a resonator including: a resonator body having two opposite principal surfaces, at least one electrode on each of said surfaces, and a respective external connector for each of said electrodes, each of said external connectors being in electrical contact with its associated electrode;
    preparing a respective spacer comprising a preformed self-adhesive film for each of said two principal surfaces; and
    applying each of said spacers to a respective one of said two principal surfaces, each of said spacers having a first set of regions registering with said electrodes and being maintained out of physical contact with said electrodes, and each of said spacers further having a second set of regions in contact with a respective one of said surfaces of said resonator body.

11. The method of claim 10, comprising the further step of covering the combination of said spacers and said resonator with an insulating envelope, said connectors extending through said envelope.

12. The method of claim 11, wherein said covering step is performed by dip-coating said combination of said spacers and said resonator in viscous enveloping compound.

13. The method of claim 11, wherein said covering step is performed by whirl sintering means.

14. The method of claim 10, wherein said applying step is performed while said connectors are removably attached to a continuous strip and comprising, the further step of removing said filter from said strip after manufacture.

15. The method of claim 10, wherein said applying step is performed by transferring said spacers from a strip carrying said spacers to said resonator.

16. The method of claim 15, wherein said first set of regions of each of said spacers is formed before said applying step.

17. The method of claim 16, further comprising the step of forming openings in each of said spacers between said first and second sets of regions, said forming steps being performed prior to said applying steps.

18. The method of claim 10 or 17, wherein said applying step is performed by means of vacuum fingers.

* * * * *